United States Patent
Yu et al.

(10) Patent No.: US 12,537,492 B2
(45) Date of Patent: Jan. 27, 2026

(54) OPERATIONAL AMPLIFIER, CHIP, AND ELECTRONIC DEVICE

(71) Applicant: HUAWEI TECHNOLOGIES CO., LTD., Shenzhen (CN)

(72) Inventors: Yongchang Yu, Shanghai (CN); Min Yi, Shanghai (CN); Weinan Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 684 days.

(21) Appl. No.: 17/828,617

(22) Filed: May 31, 2022

(65) Prior Publication Data
US 2022/0294403 A1 Sep. 15, 2022

Related U.S. Application Data

(63) Continuation of application No. PCT/CN2019/121586, filed on Nov. 28, 2019.

(51) Int. Cl.
*H03F 3/45* (2006.01)

(52) U.S. Cl.
CPC ..... *H03F 3/45659* (2013.01); *H03F 3/45183* (2013.01); *H03F 3/45475* (2013.01); *H03F 2203/45418* (2013.01)

(58) Field of Classification Search
CPC ............ H03F 3/45659; H03F 3/45183; H03F 3/45475; H03F 3/303; H03F 2203/45418;
(Continued)

(56) References Cited

U.S. PATENT DOCUMENTS

| 6,664,912 B1 | 12/2003 | Zanchi |
| 7,453,319 B2 | 11/2008 | Gupta et al. |

(Continued)

FOREIGN PATENT DOCUMENTS

| CN | 202488406 U | 10/2012 |
| CN | 103051288 A | 4/2013 |

(Continued)

OTHER PUBLICATIONS

"Buffer Amplifier" Wikipedia (Year: 2025).*

*Primary Examiner* — Andrea Lindgren Baltzell
*Assistant Examiner* — Nareh Shamiryan
(74) *Attorney, Agent, or Firm* — Rimon PC

(57) ABSTRACT

This application provides an operational amplifier that increases the stability and settling speed of a common-mode feedback circuit. The operational amplifier includes N stages of amplifiers connected in series and M common-mode feedback circuits, where N and M are integers, N≥3, and N≥M>1. An $i^{th}$ common-mode feedback circuit in the M common-mode feedback circuits is configured to: detect a common-mode output voltage of a $(j+b)^{th}$ stage of amplifier, and regulate an electrical parameter of at least one of the $j^{th}$ stage of amplifier to the $(j+b)^{th}$ stage of amplifier, to stabilize the common-mode output voltage of the $(j+b)^{th}$ stage of amplifier. An $M^{th}$ common-mode feedback circuit is configured to detect and stabilize a common-mode output voltage of an $N^{th}$ stage of amplifier. Herein i, j, and b are integers, M≥i≥1, N≥j≥1, i≥j, j+b≤N, and b≥0.

19 Claims, 3 Drawing Sheets

(58) Field of Classification Search
CPC . H03F 2203/45134; H03F 2203/45434; H03F 2203/45628; H03F 2203/45652; H03F 2200/153; H03F 2200/405; H03F 2200/408; H03F 1/14
USPC ........................................................ 330/258
See application file for complete search history.

(56) References Cited

U.S. PATENT DOCUMENTS

| | | |
|---|---|---|
| 9,385,672 B2 | 7/2016 | Karmaker |
| 2006/0082416 A1* | 4/2006 | Marholev ........... H03F 3/45475 330/258 |
| 2015/0295551 A1 | 10/2015 | Chiu et al. |
| 2019/0029369 A1 | 1/2019 | Vanwagnen et al. |

FOREIGN PATENT DOCUMENTS

| | | | |
|---|---|---|---|
| CN | 103107790 A | | 5/2013 |
| CN | 103219961 A | | 7/2013 |
| CN | 106487374 A | | 3/2017 |
| CN | 110086437 A | | 8/2019 |
| GB | 2488307 A | | 8/2012 |
| KR | 20060097500 A | * | 9/2006 |

* cited by examiner

OPERATIONAL AMPLIFIER, CHIP, AND ELECTRONIC DEVICE

CROSS-REFERENCE TO RELATED APPLICATIONS

This application is a continuation of International Application No. PCT/CN2019/121586, filed on Nov. 28, 2019, the disclosure of which is hereby incorporated by reference in its entirety.

TECHNICAL FIELD

This application relates to the field of electronic technologies, and in particular, to an operational amplifier, a chip, and an electronic device.

BACKGROUND

An operational amplifier (OPA) is a key device in an analog circuit, and is widely applied to analog signal processing systems. For example, in a radio frequency transceiver system, the operational amplifier is usually applied to key modules such as a trans-impedance amplifier (TIA), a low-pass filter (LPF), a variable gain amplifier (VGA), an analog to digital converter (ADC), and a digital to analog converter (DAC).

For an ordinary fully differential two-stage operational amplifier, common-mode feedback (CMFB) may be implemented by using a common two-stage differential signal path and a one-stage error amplifier. Therefore, there is usually a three-stage common-mode feedback loop. With the development of integrated circuit technologies, an increasingly low supply voltage is provided, and it is difficult to design a high-gain and high-bandwidth operational amplifier at a low operating voltage. Usually, a high-performance operational amplifier may be implemented by increasing the quantity of stages of the operational amplifier. However, for a multi-stage operational amplifier, if the same common-mode feedback design as the two-stage amplifier is used, it is difficult to design the stability of the common-mode feedback loop due to an increase in the number of poles in the common-mode feedback loop.

SUMMARY

This application provides an operational amplifier, to increase the stability and settling speed of a common-mode feedback circuit.

According to a first aspect, an operational amplifier is provided, and includes N stages of amplifiers connected in series and M common-mode feedback circuits, where N and M are integers, N≥3, and N≥M>1. An $i^{th}$ common-mode feedback circuit in the M common-mode feedback circuits is configured to: detect a common-mode output voltage of a $(j+b)^{th}$ stage of amplifier, and regulate an electrical parameter of at least one of a $j^{th}$ stage of amplifier to the $(j+b)^{th}$ stage of amplifier, to stabilize the common-mode output voltage of the $(j+b)^{th}$ stage of amplifier, and an $M^{th}$ common-mode feedback circuit is configured to detect and stabilize a common-mode output voltage of an $N^{th}$ stage of amplifier, where i, j, and b are integers, M≥i≥1, N≥j≥1, i≥j, j+b≤N, and b≥0.

In some embodiments of this application, the N stages of amplifiers connected in series are split into M combinations, and each of the M combinations includes one or more stages of amplifiers. The M combinations respectively correspond to the M common-mode feedback circuits, and each common-mode feedback circuit is configured to adjust one or more stages of degraded amplifiers, to reduce the difficulty of compensating for multi-stage common-mode feedback, facilitate the design of a multi-stage high-gain and high-speed operational amplifier, and increase the stability and settling speed of the common-mode feedback circuit.

With reference to the first aspect, in a possible implementation of the first aspect, N>M>1.

In some embodiments of this application, the N stages of amplifiers connected in series are split into M combinations, and each of the M combinations includes one or more stages of amplifiers. The M combinations respectively correspond to the M common-mode feedback circuits, and each common-mode feedback circuit is configured to adjust one or more stages of degraded amplifiers, to reduce the difficulty of compensating for multi-stage common-mode feedback, facilitate the design of a multi-stage high-gain and high-speed operational amplifier, and increase the stability and settling speed of the common-mode feedback circuit. In addition, the quantity of common-mode feedback circuits is less than the quantity of stages of amplifiers connected in series, to appropriately simplify the circuit structure of the common-mode feedback circuit.

With reference to the first aspect, in a possible implementation of the first aspect, the N stages of amplifiers are three stages of amplifiers, and the M common-mode feedback circuits are two common-mode feedback circuits; a first common-mode feedback circuit is configured to: detect a first stage of amplifier, and regulate an electrical parameter of the first stage of amplifier, to stabilize a common-mode output voltage of the first stage of amplifier; and a second common-mode feedback circuit is configured to: detect a common-mode output voltage of a third stage of amplifier, and regulate an electrical parameter of at least one of the second stage of amplifier and the third stage of amplifier, to stabilize the common-mode output voltage of the third stage of amplifier.

With reference to the first aspect, in a possible implementation of the first aspect, the first common-mode feedback circuit includes a first resistor (R1) and a second resistor (R2), a first end of the first resistor (R1) is connected to a drain of a first transistor (M1) in an input transistor pair of the first stage of amplifier, a first end of the second resistor (R2) is connected to a drain of a second transistor (M2) in the input transistor pair, and a second end of the first resistor (R1), a second end of the second resistor (R2), a gate of a first bias transistor (M3) of the first stage of amplifier, and a gate of a second bias transistor (M4) of the first stage of amplifier are connected.

With reference to the first aspect, in a possible implementation of the first aspect, the second common-mode feedback circuit includes an error amplifier and a common-mode detection circuit; the common-mode detection circuit is configured to detect and output a third common-mode output voltage output by the third stage of amplifier; and the error amplifier is configured to: receive the third common-mode output voltage, and calculate the difference between the third common-mode output voltage and a common-mode reference voltage, to output an error amplification signal, where the error amplification signal is used to regulate the electrical parameter of the at least one of the second stage of amplifier and the third stage of amplifier, to stabilize the third common-mode output voltage.

With reference to the first aspect, in a possible implementation of the first aspect, the second stage of amplifier includes a bias transistor pair (M8, M14), and an output end of the error amplifier is connected to a gate of the bias transistor pair (M8, M14).

With reference to the first aspect, in a possible implementation of the first aspect, the N stages of amplifiers are three stages of amplifiers, the M common-mode feedback circuits are three common-mode feedback circuits, and the $i^{th}$ common-mode feedback circuit is configured to: detect a common-mode output voltage of an $i^{th}$ stage of amplifier, and regulate an electrical parameter of the $i^{th}$ stage of amplifier, to stabilize the common-mode output voltage of the $i^{th}$ stage of amplifier.

With reference to the first aspect, in a possible implementation of the first aspect, the N stages of amplifiers are four stages of amplifiers, the M common-mode feedback circuits are two common-mode feedback circuits, a first common-mode feedback circuit is configured to: detect a common-mode output voltage of a second stage of amplifier, and regulate an electrical parameter of at least one of the first stage of amplifier and the second stage of amplifier, to stabilize the common-mode output voltage of the second stage of amplifier, and a second common-mode feedback circuit is configured to: detect a common-mode output voltage of a fourth stage of amplifier, and regulate an electrical parameter of at least one of the third stage of amplifier and the fourth stage of amplifier, to stabilize the common-mode output voltage of the fourth stage of amplifier.

With reference to the first aspect, in a possible implementation of the first aspect, the regulating an electrical parameter of at least one of a $j^{th}$ stage of amplifier to the $(j+b)^{th}$ stage of amplifier includes: regulating a voltage or a current of a bias node of the at least one of the $j^{th}$ stage of amplifier to the $(j+b)^{th}$ stage of amplifier.

With reference to the first aspect, in a possible implementation of the first aspect, the N stages of amplifiers are N stages of differential amplifiers.

According to a second aspect, a chip is provided, and the chip includes the operational amplifier in any one of the first aspect or the possible implementations of the first aspect.

According to a third aspect, an electronic device is provided, and the electronic device includes the operational amplifier in any one of the first aspect or the possible implementations of the first aspect.

DESCRIPTION OF EMBODIMENTS

The following describes technical solutions in this application with reference to accompanying drawings.

Figure 1:
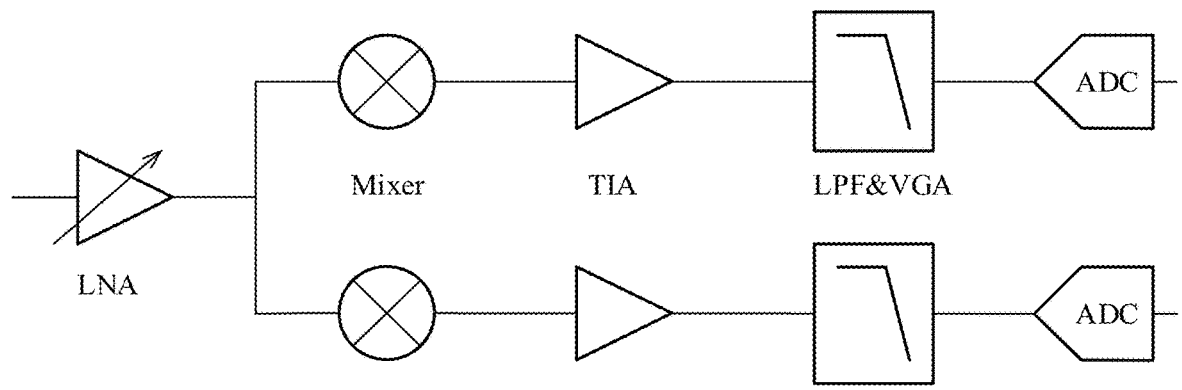
FIG. 1 is a schematic diagram of an application environment according to an embodiment of this application.

FIG. 1 is a schematic diagram of an application environment according to an embodiment of this application. FIG. 1 is a schematic diagram of link cascading in a radio frequency system. The radio frequency system is a receiver system, and includes a low noise amplifier (LNA), a mixer, a trans-impedance amplifier (TIA), a low-pass filter (LPF), and an analog to digital converter (ADC). An operational amplifier in embodiments of this application may be disposed in modules such as the TIA, the LPF, a VGA, and the ADC in FIG. 1. It should be noted that FIG. 1 is merely used as an example to describe an application environment of the operational amplifier in embodiments of this application. The operational amplifier may be widely applied to various analog integrated circuits or digital-to-analog integrated circuits, for example, a filter circuit, an amplifier circuit, an operation circuit, a signal generation circuit, a signal conversion circuit, or a power supply.

Embodiments of this application provide a design solution of a common-mode feedback circuit. This may be applied to a multi-stage operational amplifier circuit, and facilitates the implementation of a high-bandwidth and high-gain operational amplifier at a low operating voltage.

Figure 2:
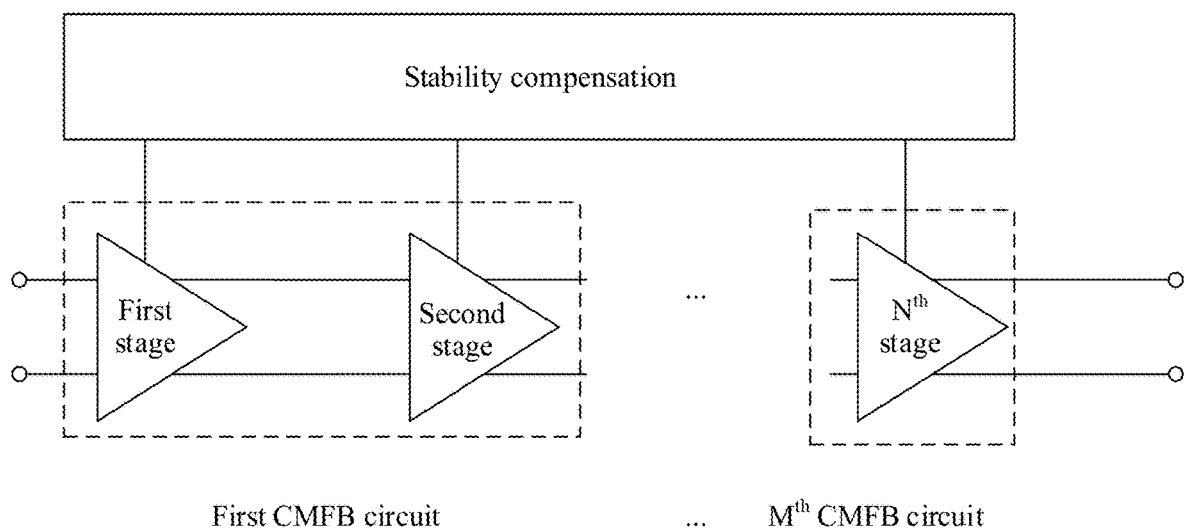
FIG. 2 is a schematic diagram of a structure of an operational amplifier according to an embodiment of this application.

FIG. 2 is a schematic diagram of a structure of an operational amplifier according to an embodiment of this application. As shown in FIG. 2, the operational amplifier includes N stages of amplifiers connected in series and M common-mode feedback (CMFB) circuits, where N and M are integers, N≥3, and N≥M>1.

An $i^{th}$ common-mode feedback circuit in the M common-mode feedback circuits is configured to: detect a common-mode output voltage of a $(j+b)^{th}$ stage of amplifier, and regulate an electrical parameter of at least one of the $j^{th}$ stage of amplifier to the $(j+b)^{th}$ stage of amplifier, to stabilize the common-mode output voltage of the $(j+b)^{th}$ stage of amplifier, and an $M^{th}$ common-mode feedback circuit is configured to detect and stabilize a common-mode output voltage of an $N^{th}$ stage of amplifier, where i, j, and b are integers, M≥i≥1, N≥j≥1, i≥j, j+b≤N, and b≥0.

It may be understood that the N stages of amplifiers connected in series are split into M combinations, each combination includes one or more stages of amplifiers connected in series, and each combination corresponds to one common-mode feedback circuit. For example, an $i^{th}$ combination may include the $j^{th}$ stage of amplifier to the $(j+b)^{th}$ stage of amplifier, and the $i^{th}$ common-mode feedback circuit detects the common-mode output voltage of the $(j+b)^{th}$ stage of amplifier, and regulates an electrical parameter of an amplifier in the $i^{th}$ combination, to stabilize the common-mode output voltage of the $(j+b)^{th}$ stage of amplifier. The $i^{th}$ common-mode feedback circuit may regulate electrical parameters of all amplifiers in the $i^{th}$ combination, or may regulate electrical parameters of some amplifiers in the $i^{th}$ combination, to stabilize the common-mode output voltage of the $(j+b)^{th}$ stage of amplifier.

In some examples, the regulating an electrical parameter of at least one of the $j^{th}$ stage of amplifier to the $(j+b)^{th}$ stage of amplifier includes: regulating a voltage or a current of a bias node of the at least one of the $j^{th}$ stage of amplifier to the $(j+b)^{th}$ stage of amplifier.

Optionally, an $M^{th}$ combination may include only the $N^{th}$ stage of amplifier. Alternatively, an $M^{th}$ combination may include the $N^{th}$ stage of amplifier and an amplifier other than the $N^{th}$ stage of amplifier.

In some embodiments of this application, the N stages of amplifiers connected in series are split into M combinations, and each of the M combinations includes one or more stages of amplifiers. The M combinations respectively correspond to the M common-mode feedback circuits, and each common-mode feedback circuit is configured to adjust one or more stages of degraded amplifiers, to reduce the difficulty of compensating for multi-stage common-mode feedback, facilitate the design of a multi-stage high-gain and high-speed operational amplifier, and increase the stability and settling speed of the common-mode feedback circuit.

Optionally, a common-mode feedback circuit in the M common-mode feedback circuits may include a self-common-mode feedback circuit, or may include a common-mode feedback loop. The self-common-mode feedback circuit is a circuit in which common-mode voltage regulation is performed without an external loop. The common-mode feedback loop is a circuit in which common-mode voltage regulation is performed by using an external loop. For example, if a common-mode feedback circuit is configured to regulate a common-mode output voltage of a single stage of amplifier, the self-common-mode feedback circuit or the common-mode feedback loop may be used. Alternatively, if a common-mode feedback circuit is configured to regulate common-mode output voltages of two or more stages of amplifiers, the common-mode feedback loop may be used.

In some examples, N=M. In this case, i=j, and b=0. That is, the $i^{th}$ common-mode feedback circuit is configured to: detect a common-mode output voltage of an $i^{th}$ stage of amplifier, and regulate an electrical parameter of the $i^{th}$ stage of amplifier, to stabilize the common-mode output voltage of the $i^{th}$ stage of amplifier. In other words, each of the N stages of amplifiers corresponds to one common-mode feedback circuit, and the common-mode feedback circuit is configured to stabilize a common-mode output voltage of the corresponding amplifier.

Figure 3:
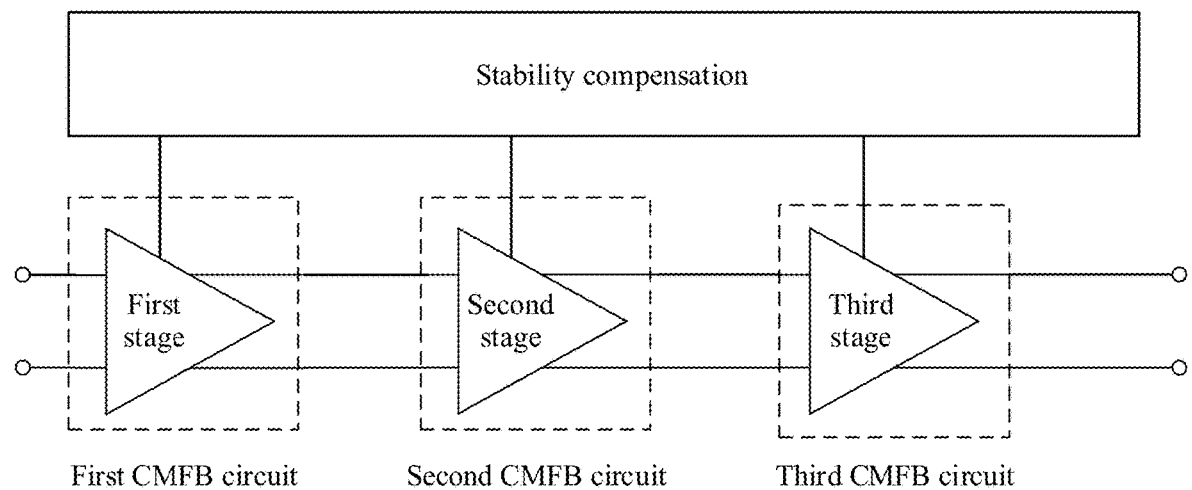
FIG. 3 is a schematic diagram of a structure of a three-stage operational amplifier according to an embodiment of this application.

For example, FIG. 3 is a schematic diagram of a structure of a three-stage operational amplifier according to an embodiment of this application. As shown in FIG. 3, the three-stage operational amplifier may be split into three single-stage amplifiers, each single-stage amplifier corresponds to one common-mode feedback circuit, and each common-mode feedback circuit is configured to: detect a common-mode output voltage of a corresponding single-stage amplifier, and regulate an electrical parameter of the corresponding single-stage amplifier, to stabilize the common-mode output voltage corresponding to the single-stage amplifier. Optionally, each common-mode feedback circuit may be a self-common-mode feedback circuit or a common-mode feedback loop.

In some examples, N>M>1, that is, the quantity of common-mode feedback circuits is greater than 1, but is less than the quantity N of stages of the operational amplifier. In this case, the quantity of common-mode feedback circuits is less than the quantity of stages of amplifiers connected in series, to appropriately simplify a circuit structure of the common-mode feedback circuit. In this case, the N stages of amplifiers are split into at least two combinations, and each combination corresponds to one common-mode feedback circuit. There is at least one combination that includes two or more stages of amplifiers.

Figure 4:
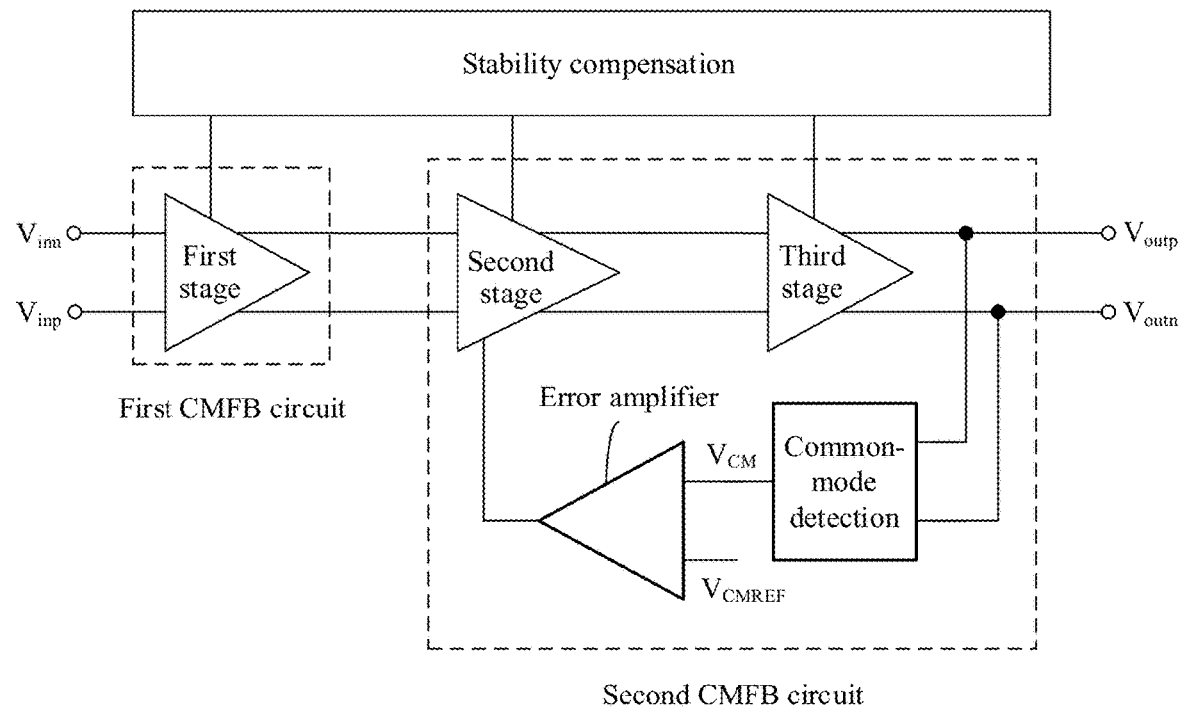
FIG. 4 is a schematic diagram of a structure of a three-stage operational amplifier according to an embodiment of this application.

For example, FIG. 4 is a schematic diagram of a structure of a three-stage operational amplifier according to an embodiment of this application. As shown in FIG. 4, the three-stage operational amplifier may be split into a single-stage amplifier and a two-stage amplifier. The three-stage operational amplifier includes two common-mode feedback circuits. A first common-mode feedback circuit is configured to: detect a first stage of amplifier, and regulate an electrical parameter of the first stage of amplifier, to stabilize a common-mode output voltage of the first stage of amplifier. A second common-mode feedback circuit is configured to: detect a common-mode output voltage of a third stage of amplifier, and regulate an electrical parameter of at least one of the second stage of amplifier and the third stage of amplifier, to stabilize the common-mode output voltage of the third stage of amplifier.

For example, the first common-mode feedback circuit may be a self-common-mode feedback circuit, and the second common-mode feedback circuit may be a common-mode feedback loop. The common-mode feedback loop includes the second stage of amplifier, the third stage of amplifier, a common-mode detection circuit, and an error amplifier. The common-mode detection circuit is configured to: detect differential output voltages $V_{outp}$ and $V_{outn}$ of the third stage of amplifier, and output the common-mode output voltage $V_{CM}$ of the third stage of amplifier. The error amplifier is configured to: receive the common-mode output voltage $V_{CM}$, and calculate a difference between the common-mode output voltage $V_{CM}$ and a common-mode reference voltage $V_{CMREF}$, to output an error amplification signal. The error amplification signal is used to regulate the electrical parameter of the at least one of the second stage of amplifier and the third stage of amplifier, to stabilize the third common-mode output voltage. In some embodiments of this application, for ease of differentiation, common-mode output voltages output by the first stage of amplifier, the second stage of amplifier, and the third stage of amplifier may be respectively referred to as a first common-mode output voltage, a second common-mode output voltage, and the third common-mode output voltage. The third common-mode output voltage may be considered as a common-mode output voltage of the operational amplifier.

In some examples, the N stages of amplifiers are N stages of differential amplifiers.

In some examples, the N stages of amplifiers are four stages of amplifiers, and the M common-mode feedback circuits are two common-mode feedback circuits. A first common-mode feedback circuit is configured to: detect a common-mode output voltage of a second stage of amplifier, and regulate an electrical parameter of at least one of the first stage of amplifier and the second stage of amplifier, to stabilize the common-mode output voltage of the second stage of amplifier. A second common-mode feedback circuit is configured to: detect a common-mode output voltage of a fourth stage of amplifier, and regulate an electrical parameter of at least one of the third stage of amplifier and the fourth stage of amplifier, to stabilize the common-mode output voltage of the fourth stage of amplifier.

It should be understood that the operational amplifiers in FIG. 3 and FIG. 4 are merely used as examples. In some embodiments of this application, the N stages of amplifiers may alternatively be a plurality of stages of amplifiers of another type. Any proper modification and combination that may be made based on the foregoing description for a manner of splitting the plurality of stages of amplifiers and a type of each common-mode feedback circuit shall fall within the protection scope of this application.

Optionally, the operational amplifier in some embodiments of this application may use a complementary metal-oxide-semiconductor (CMOS) technology or another integrated circuit technology, for example, a bipolar junction transistor (BJT) technology or a silicon-on-insulator (SOI) technology.

Figure 5:
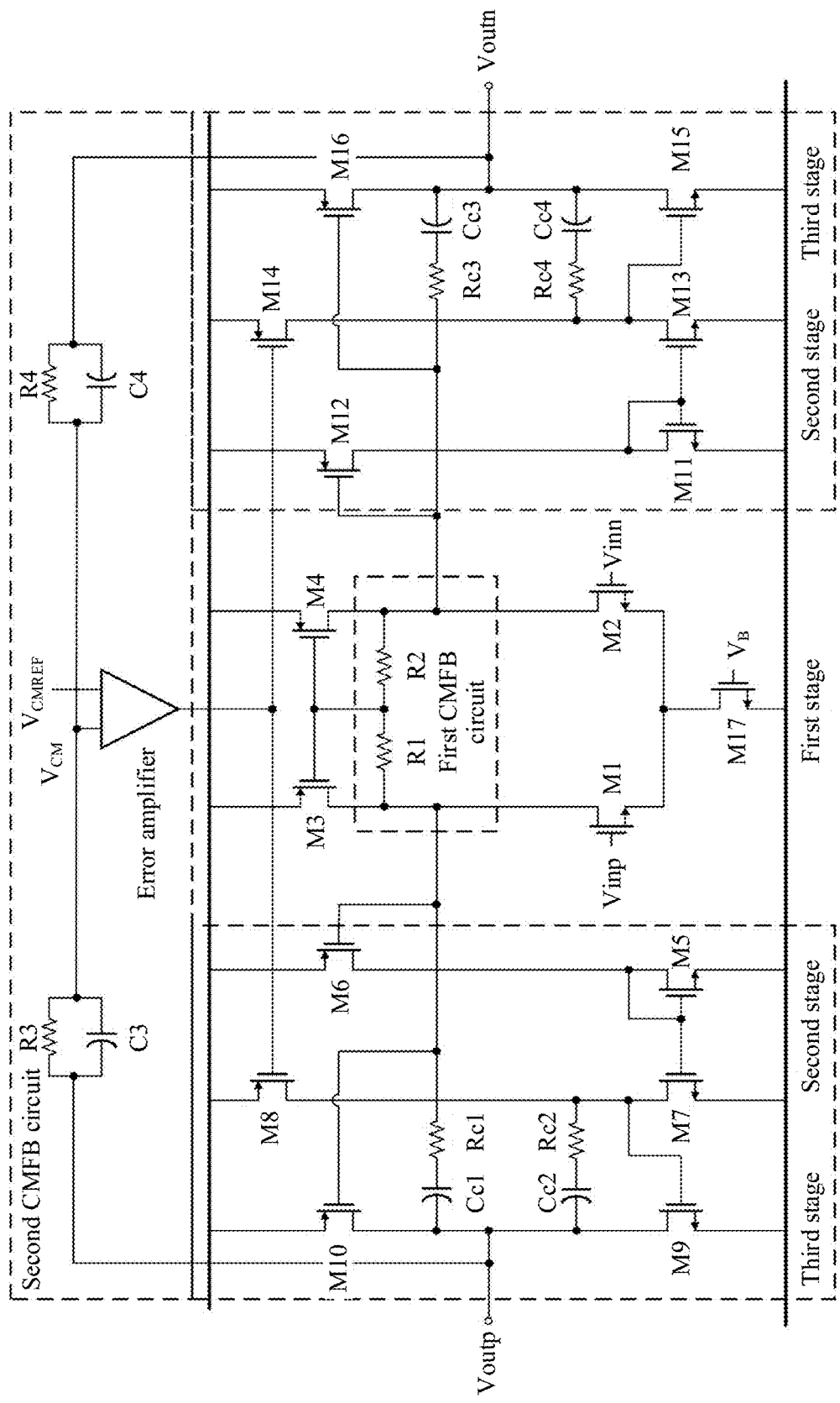
FIG. 5 is a schematic diagram of a circuit structure of a three-stage operational amplifier according to an embodiment of this application.

FIG. 5 is a schematic diagram of a circuit of an operational amplifier according to an embodiment of this application. As shown in FIG. 5, the operational amplifier is a three-stage amplifier. The three-stage amplifier is split into two combinations. A first combination includes a first stage of amplifier, namely, a single-stage amplifier. A second combination includes a second stage of amplifier and a third stage of amplifier, namely, a two-stage amplifier. The single-stage amplifier corresponds to a first common-mode feedback circuit, and the two-stage amplifier corresponds to a second common-mode feedback circuit.

The first stage of amplifier includes transistors M1, M2, M3, M4, M17. The transistors M1 and M2 are an input transistor pair of the first stage of amplifier, the transistors M3 and M4 are bias transistors of the first-stage amplifier, and the transistor M17 is a tail bias transistor of the first amplifier. An input end of the first stage of amplifier is a gate of the input transistor pair M1 and M2, and an output end of the first stage amplifier is a drain of the input transistor pair M1 and M2. For ease of description, the input transistor pair M1 and M2 may alternatively be referred to as a first transistor M1 and a second transistor M2. The transistors M3 and M4 may alternatively be referred to as a first bias transistor M3 and a second bias transistor M4.

The second stage of amplifier includes transistors M5, M6, M7, M8, M11, M12, M13, M14. The transistors M6 and M12 are an input transistor pair of the second stage of amplifier, and the transistors M8 and M14 are bias transistors of the second stage of amplifier. Transistors M7 and M13 are amplification transistors. An input end of the second stage of amplifier is a gate of the transistors M6 and M12, and an output end of the second stage of amplifier is a drain of the transistors M7 and M13.

The third stage of amplifier includes transistors M9, M10, M15, M16. The transistors M9 and M15 are input transistors of the third stage of amplifier, and the transistors M10 and M16 are bias transistors of the third stage of amplifier. An input end of the third stage of amplifier is a gate of the transistors M9 and M15, and an output end of the third stage of amplifier is a drain of the transistors M9 and M15.

As shown in FIG. 5, the first common-mode feedback circuit includes a first resistor R1 and a second resistor R2. A first end of the first resistor R1 is connected to the drain of the first transistor M1 in the input transistor pair of the first stage of amplifier, a first end of the second resistor R2 is connected to the drain of the second transistor M2 in the input transistor pair, and a second end of the first resistor R1, a second end of the second resistor R2, a gate of the first bias transistor M3 of the first stage of amplifier, and a gate of the second bias transistor M4 of the first stage of amplifier are connected.

The first resistor R1 and the second resistor R2 are configured to detect and stabilize a common-mode output voltage of the first stage of amplifier. The first common-mode feedback circuit uses the resistor in the common-mode feedback circuit to detect and feed back the common-mode output voltage of the first stage of amplifier. In this case, the structure is simple and the stability is good.

Optionally, the second common-mode feedback circuit may include a common-mode detection circuit, and the common-mode detection circuit is configured to detect and output a first common-mode output voltage $V_{CM}$ output by the third stage of amplifier.

The common-mode detection circuit includes: a first input end, configured to receive a first differential output voltage $V_{outp}$ output by the third stage of amplifier; a second input end, configured to receive a second differential output voltage $V_{outn}$ output by the third of stage of amplifier; and an output end, configured to output a common-mode output voltage $V_{CM}$, where the common-mode output voltage $V_{CM}$ is an average value of the first differential output voltage $V_{outp}$ and the second differential output voltage $V_{outn}$, in other words, $V_{CM}=(V_{outp}+V_{outn})/2$.

As shown in FIG. 5, as an example, the common-mode detection circuit includes a third resistor R3 and a fourth resistor R4. A first end of the third resistor R3 is connected to a first differential output end $V_{outp}$ of the third stage of amplifier. A second end of the third resistor R3 is connected to a first end of the fourth resistor R4. A second end of the fourth resistor R4 is connected to a second differential output end $V_{outn}$ of the third stage of amplifier. The second end of the third resistor R3 and the first end of the fourth resistor R4 are output ends of the common-mode detection circuit.

Optionally, the operational amplifier further includes a common-mode loop compensation circuit. The common-mode loop compensation circuit is for frequency compensation of a common-mode loop. As shown in FIG. 5, as an example, the common-mode loop compensation circuit includes a third capacitor C3 and a fourth capacitor C4. A first end of the third capacitor C3 is connected to the first differential output end $V_{outp}$ of the third stage of amplifier. A second end of the third capacitor C3 is connected to a first end of the fourth capacitor C4. A second end of the fourth capacitor C4 is connected to the second differential output end $V_{outn}$ of the third stage of amplifier. The second end of the third capacitor C3 is connected to an output end of the common-mode detection circuit. To be specific, the second end of the third capacitor C3 is connected to the second end of the third resistor R3.

Further, the operational amplifier further includes an error amplification circuit. The error amplification circuit is configured to compare the common-mode output voltage $V_{CM}$ with a common-mode reference voltage $V_{CMREF}$, and regulate a bias circuit of the operational amplifier based on a comparison result, so that the common-mode output voltage $V_{CM}$ is equal to the common-mode reference voltage $V_{CMREF}$. As shown in FIG. 5, the error amplification circuit includes an error amplifier. The error amplifier is configured to: receive the common-mode output voltage $V_{CM}$ output by the third stage of amplifier, and calculate a difference between the common-mode output voltage $V_{CM}$ and a first reference voltage $V_{CMREF}$, to output an error amplification signal. The error amplification signal is used to regulate an electrical parameter of at least one of the second stage of amplifier and the third stage of amplifier, to stabilize the first common-mode output voltage.

A first input end of the error amplifier is configured to receive the common-mode reference voltage $V_{CMREF}$ of the operational amplifier, and a second input end of the error amplifier is configured to receive the common-mode output voltage $V_{CM}$ of the operational amplifier, in other words, a second input end of the error amplifier is connected to the second end of the third resistor R3. Optionally, an output end of the error amplifier is connected to a bias circuit of the second stage of amplifier or the third stage of amplifier, to regulate the bias circuit of the second stage of amplifier or the third stage of amplifier. As an example, the output of the error amplifier in FIG. 5 is connected to the gate of the bias transistors M8 and M14 of the second stage of amplifier.

It should be understood that, for a fully differential three-stage amplifier, if a single common-mode feedback circuit is used, there are up to four stages of common-mode feedback loops. To reduce the complexity of a common-mode stability design, in some embodiments of this application, a common-mode feedback loop is split to reduce the quantity of stages of the common-mode feedback loop. In some embodiments of this application, to simplify common-mode feedback, the three-stage operational amplifier may be split into one single-stage amplifier and one two-stage amplifier. The first stage of amplifier may perform common-mode feedback in an internal common-mode bias manner. The second stage of amplifier and the third stage of amplifier use a common-mode feedback loop for stability compensation. The common-mode feedback loop includes the second stage of amplifier, the third stage of amplifier, the common-mode detection circuit and the error amplifier, so that a common-mode stability design of a multi-stage operational amplifier is simple.

It should be understood that FIG. 5 is merely an example rather than a limitation of a specific circuit structure of the operational amplifier in embodiments of this application. For example, the common-mode detection circuit, the common-mode loop compensation circuit, or the error amplification circuit in FIG. 5 may alternatively be implemented in another manner. This is not limited in embodiments of this application.

A person of ordinary skill in the art may be aware that, in combination with the examples described in embodiments disclosed in this specification, units and algorithm steps may be implemented by using electronic hardware or a combination of computer software and electronic hardware. Whether the functions are performed by hardware or software depends on particular applications and design constraints of the technical solutions. A person skilled in the art may use different methods to implement the described functions of each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed systems, apparatuses, and methods may be implemented in other manners. For example, described apparatus embodiments are merely examples. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, in other words, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units are integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An operational amplifier, comprising:
    N stages of amplifiers connected in series and M common-mode feedback circuits, wherein N and M are integers, $N \geq 3$, and $N \geq M \geq 1$,
    an $i^{th}$ common-mode feedback circuit in the M common-mode feedback circuits is configured to: detect a common-mode output voltage of a $(j+b)^{th}$ stage of amplifier, and regulate an electrical parameter of at least one of a $j^{th}$ stage of amplifier to a $(j+b-1)^{th}$ stage of amplifier, to stabilize the common-mode output voltage of the $(j+b)^{th}$ stage of amplifier,
    an $M^{th}$ common-mode feedback circuit is configured to detect and stabilize a common-mode output voltage of an $N^{th}$ stage of amplifier, and
    i, j, and b are integers, $M \geq i \geq 1$, $N \geq j \geq 1$, $i \geq j$, $j+b \leq N$, and $b \geq 1$.

2. The operational amplifier according to claim 1, wherein $N > M > 1$.

3. The operational amplifier according to claim 1, wherein the N stages of amplifiers are three stages of amplifiers, and the M common-mode feedback circuits are two common-mode feedback circuits;
    a first common-mode feedback circuit of the M common-mode feedback circuits is configured to: detect a first stage of amplifier of the N stages of amplifiers, and regulate an electrical parameter of the first stage of amplifier, to stabilize a common-mode output voltage of the first stage of amplifier; and
    a second common-mode feedback circuit of the M common-mode feedback circuits is configured to: detect a common-mode output voltage of a third stage of amplifier of the N stages amplifiers, and regulate an electrical parameter of at least one of a second stage of amplifier of the N stages amplifiers or the third stage of amplifier, to stabilize the common-mode output voltage of the third stage of amplifier.

4. The operational amplifier according to claim 3, wherein the first common-mode feedback circuit comprises a first resistor and a second resistor, a first end of the first resistor is connected to a drain of a first transistor in an input transistor pair of the first stage of amplifier, a first end of the second resistor is connected to a drain of a second transistor in the input transistor pair, and a second end of the first resistor, a second end of the second resistor, a gate of a first bias transistor of the first stage of amplifier, and a gate of a second bias transistor of the first stage of amplifier are connected.

5. The operational amplifier according to claim 3, wherein the second common-mode feedback circuit comprises an error amplifier and a common-mode detection circuit;
    the common-mode detection circuit is configured to detect and output a third common-mode output voltage output by the third stage of amplifier; and
    the error amplifier is configured to: receive the third common-mode output voltage, and calculate a difference between the third common-mode output voltage and a common-mode reference voltage, to output an error amplification signal, wherein the error amplification signal is used to regulate the electrical parameter of the at least one of the second stage of amplifier or the third stage of amplifier, to stabilize the third common-mode output voltage.

6. The operational amplifier according to claim 5, wherein the second stage of amplifier comprises a bias transistor pair, and an output end of the error amplifier is connected to a gate of the bias transistor pair.

7. The operational amplifier according to claim 1, wherein the N stages of amplifiers are three stages of amplifiers, the M common-mode feedback circuits are three common-mode feedback circuits, and the $i^{th}$ common-mode feedback circuit is configured to: detect a common-mode output voltage of an $i^{th}$ stage of amplifier, and regulate an electrical parameter of the $i^{th}$ stage of amplifier, to stabilize the common-mode output voltage of the $i^{th}$ stage of amplifier, wherein i is an integer smaller than or equal to 3.

8. The operational amplifier according to claim 1, wherein the N stages of amplifiers are four stages of amplifiers, the M common-mode feedback circuits are two common-mode feedback circuits, a first common-mode feedback circuit is configured to: detect a common-mode output voltage of a second stage of amplifier, and regulate an electrical parameter of at least one of a first stage of amplifier or the second stage of amplifier, to stabilize the common-mode output voltage of the second stage of amplifier, and a second common-mode feedback circuit is configured to: detect a common-mode output voltage of a fourth stage of amplifier, and regulate an electrical parameter of at least one of a third stage of amplifier or the fourth stage of amplifier, to stabilize the common-mode output voltage of the fourth stage of amplifier.

9. The operational amplifier according to claim 1, wherein the regulating the electrical parameter of at least one of a $j^{th}$ stage of amplifier to the $(j+b-1)^{th}$ stage of amplifier comprises: regulating a voltage or a current of a bias node of the at least one of the $j^{th}$ stage of amplifier to the $(j+b-1)^{th}$ stage of amplifier.

10. The operational amplifier according to claim 1, wherein the N stages of amplifiers are N stages of differential amplifiers.

11. A chip, wherein the chip comprises an operational amplifier, comprising:
N stages of amplifiers connected in series and M common-mode feedback circuits, wherein N and M are integers, N≥3, and N≥M>1,
an $i^{th}$ common-mode feedback circuit in the M common-mode feedback circuits is configured to: detect a common-mode output voltage of a $(j+b)^{th}$ stage of amplifier, and regulate an electrical parameter of at least one of a $j^{th}$ stage of amplifier to a $(j+b-1)^{th}$ stage of amplifier, to stabilize the common-mode output voltage of the $(j+b)^{th}$ stage of amplifier,
an $M^{th}$ common-mode feedback circuit is configured to detect and stabilize a common-mode output voltage of an $N^{th}$ stage of amplifier, and
i, j, and b are integers, M≥i≥1, N≥j≥1, i≥j, j+b≤N, and b≥1.

12. An electronic device, wherein the electronic device comprises an operational amplifier, comprising:
N stages of amplifiers connected in series and M common-mode feedback circuits, N and M are integers, N≥3, and N≥M>1,
an $i^{th}$ common-mode feedback circuit in the M common-mode feedback circuits is configured to: detect a common-mode output voltage of a $(j+b)^{th}$ stage of amplifier, and regulate an electrical parameter of at least one of a $j^{th}$ stage of amplifier to a $(j+b-1)^{th}$ stage of amplifier, to stabilize the common-mode output voltage of the $(j+b)^{th}$ stage of amplifier,
an $M^{th}$ common-mode feedback circuit is configured to detect and stabilize a common-mode output voltage of an $N^{th}$ stage of amplifier, and
i, j, and b are integers, M≥i≥1, N≥j≥1, i≥j, j+b≤N, and b≥1.

13. The electronic device according to claim 12, wherein the N stages of amplifiers are three stages of amplifiers, and the M common-mode feedback circuits are two common-mode feedback circuits;
a first common-mode feedback circuit of the M common-mode feedback circuits is configured to: detect a first stage of amplifier of the N stages of amplifiers, and regulate an electrical parameter of the first stage of amplifier, to stabilize a common-mode output voltage of the first stage of amplifier; and
a second common-mode feedback circuit of the M common-mode feedback circuits is configured to: detect a common-mode output voltage of a third stage of amplifier of the N stages amplifiers, and regulate an electrical parameter of at least one of a second stage of amplifier of the N stages amplifiers or the third stage of amplifier, to stabilize the common-mode output voltage of the third stage of amplifier.

14. The electronic device according to claim 13, wherein the first common-mode feedback circuit comprises a first resistor and a second resistor, a first end of the first resistor is connected to a drain of a first transistor in an input transistor pair of the first stage of amplifier, a first end of the second resistor is connected to a drain of a second transistor in the input transistor pair, and a second end of the first resistor, a second end of the second resistor, a gate of a first bias transistor of the first stage of amplifier, and a gate of a second bias transistor of the first stage of amplifier are connected.

15. The electronic device according to claim 13, wherein the second common-mode feedback circuit comprises an error amplifier and a common-mode detection circuit;
the common-mode detection circuit is configured to detect and output a third common-mode output voltage output by the third stage of amplifier; and
the error amplifier is configured to: receive the third common-mode output voltage, and calculate a difference between the third common-mode output voltage and a common-mode reference voltage, to output an error amplification signal, wherein the error amplification signal is used to regulate the electrical parameter of the at least one of the second stage of amplifier or the third stage of amplifier, to stabilize the third common-mode output voltage.

16. The electronic device according to claim 15, wherein the second stage of amplifier comprises a bias transistor pair, and an output end of the error amplifier is connected to a gate of the bias transistor pair.

17. The electronic device according to claim 13, wherein the N stages of amplifiers are three stages of amplifiers, the M common-mode feedback circuits are three common-mode feedback circuits, and the $i^{th}$ common-mode feedback circuit is configured to: detect a common-mode output voltage of an $i^{th}$ stage of amplifier, and regulate an electrical parameter of the $i^{th}$ stage of amplifier, to stabilize the common-mode output voltage of the ith stage of amplifier, wherein i is an integer smaller than or equal to 3.

18. The electronic device according to claim 12, wherein the N stages of amplifiers are four stages of amplifiers, the M common-mode feedback circuits are two common-mode feedback circuits, a first common-mode feedback circuit is configured to: detect a common-mode output voltage of a second stage of amplifier, and regulate an electrical parameter of at least one of a first stage of amplifier or the second stage of amplifier, to stabilize the common-mode output voltage of the second stage of amplifier, and a second common-mode feedback circuit is configured to: detect a common-mode output voltage of a fourth stage of amplifier, and regulate an electrical parameter of at least one of a third stage of amplifier or the fourth stage of amplifier, to stabilize the common-mode output voltage of the fourth stage of amplifier.

19. The electronic device according to claim 12, wherein the regulating the electrical parameter of at least one of a $j^{th}$ stage of amplifier to the $(j+b-1)^{th}$ stage of amplifier comprises:

regulating a voltage or a current of a bias node of the at least one of the $j^{th}$ stage of amplifier to the $(j+b-1)^{th}$ stage of amplifier.

* * * * *